United States Patent [19]

Meyerson et al.

[11] Patent Number: 5,151,383
[45] Date of Patent: Sep. 29, 1992

[54] METHOD FOR PRODUCING HIGH ENERGY ELECTROLUMINESCENT DEVICES

[75] Inventors: Bernard S. Meyerson, Yorktown Heights; Bruce A. Scott, Pleasantville; Donald J. Wolford, Jr., Croton-on-Hudson, all of N.Y.

[73] Assignee: International Business Machines Corporation, Armonk, N.Y.

[21] Appl. No.: 307,154

[22] Filed: Feb. 6, 1989

Related U.S. Application Data

[63] Continuation of Ser. No. 921,985, Oct. 22, 1986, abandoned, which is a continuation of Ser. No. 567,303, Dec. 30, 1983, abandoned.

[51] Int. Cl.$^5$ .............................................. H01L 21/20
[52] U.S. Cl. ..................... 437;101; 437/175; 437/905; 357/15; 357/17
[58] Field of Search .................. 264/81; 437/39, 101, 437/113, 175, 195, 905; 148/1

[56] References Cited

U.S. PATENT DOCUMENTS

| | | | |
|---|---|---|---|
| 3,801,879 | 4/1974 | Merrin | 317/234 R |
| 3,864,720 | 2/1975 | Merrin | 357/17 |
| 3,997,907 | 12/1976 | Nakamura et al. | 357/17 |
| 4,069,492 | 1/1978 | Pankove et al. | 357/17 |
| 4,142,195 | 2/1979 | Carlson et al. | 357/15 |
| 4,200,473 | 4/1980 | Carlson | 136/89 |
| 4,237,150 | 12/1980 | Wiesmann | 427/74 |
| 4,237,151 | 12/1980 | Strongin et al. | 427/74 |
| 4,271,235 | 6/1981 | Hill | 264/81 |
| 4,292,264 | 9/1981 | Cota | 264/81 |
| 4,321,420 | 3/1982 | Kaplan | 136/255 |

OTHER PUBLICATIONS

R. M. Plecenik et al, IBM TDB, vol. 25, No. 3B, Aug. 1982.
R. M. Plecenik et al, IBM TDB, vol. 24, No. 3, p. 1523, Aug. 1981.
Meyerson, "The preparation of in situ doped hydrogenated amorphous silicon by homogeneous chemical vapor deposition", J. Applied Physics, Mar. 1983, pp. 1461–1465.
B. Boudjouk et al, IBM TDB, vol. 26, No. 6, p. 3034, Nov. 1983.
B. A. Scott et al, J. DePhysique, Colloque C4, p. C4-635, Oct. 1981.
P. K. John et al, DePhysique C4, p. C4-639, Oct. 1981.
N. Sol et al, J. of Non-Crystalline Solids, 35 & 36, p. 291 (1980).
M. Hirose et al, J. of Non-Crystalline Solids, 35 & 36, p. 297 (1980).
D. J. Wolford et al, Appl. Phys. Lett 42(4), p. 369, Feb. 1983.
D. J. Wolford et al, Physica 117B and 118B, p. 920, (1983).
B. S. Meyerson et al, J. Appl. Phys., vol. 54, No. 3, p. 1461, Mar. 1983.

Primary Examiner—James Derrington
Attorney, Agent, or Firm—Jackson E. Stanland; Robert M. Trepp

[57] ABSTRACT

A method is described for fabricating electroluminescent devices exhibiting visible electroluminescence at room temperature, where the devices include at least one doped layer of amorphous hydrogenated silicon (a-Si:H). The a-Si:H layer is deposited on a substrate by homogeneous chemical vapor deposition (H-CVD) in which the substrate is held at a temperature lower than about 200° C. and the a-Si:H layer is doped in-situ during deposition, the amount of hydrogen incorporated in the deposited layer being 12-50 atomic percent. The bandgap of the a-Si:H layer is between 1.6 and 2.6 eV, and in preferrable embodiments is between 2.0 and 2.6 eV. The conductivity of the a-Si:H layer is chosen in accordance with device requirements, and can be $10^{16}$-$10^{19}$ carriers/cm$^2$. The bandgap of the a-Si:H layer depends at least in part on the temperature of the substrate on which the layer is deposited, and can be "tuned" by changing the substrate temperature.

13 Claims, 11 Drawing Sheets

METHOD FOR PRODUCING HIGH ENERGY ELECTROLUMINESCENT DEVICES

GOVERNMENT CONTRACT

This invention was made with Government support under Contract No. SERI-ZZ-0-9319-1 awarded by the Department of Energy.

This application is a continuation of Ser. No. 06/921,985 filed Oct. 22, 1986, now abandoned, which is a continuation of Ser. No. 06/567,303 filed Dec. 30, 1983, now abandoned.

BACKGROUND OF THE INVENTION

1. Field of the Invention

This invention relates to a method for producing high energy electroluminescent devices capable of emitting visible light at room temperature, and more particularly to a method using homogeneous chemical vapor deposition and in-situ doping to produce amorphous silicon: hydrogen thin films having optical bandgaps between 1.6 and 2.6 eV.

2. Description of the Prior Art

Light emitting diodes are very important in numerous commercial applications, and are used in many types of displays. Typically, these devices are comprised of doped and undoped semiconductor layers across which an electric field is provided in order to inject carriers into the device. When this occurs, light is spontaneously produced in accordance with the bandgap of the layers which are chosen. As an example, different compositions of gallium-aluminum-arsenic and gallium-arsenide-phosphide are most often used to fabricate electroluminescent devices. Other III–V and II–VI semiconductor compounds are also used for this purpose.

It is generally important that the visible light be produced at room temperatures, so that the devices can be used in many consumer electronics products. In order to change the color (wavelength) of the light emitted by these diodes, it is generally necessary to change the material comprising the various layers of the devices. For example, one composition (x) of the alloy $GaAs_{1-x}P_x$ will yield one color output, while another alloy composition can be used to yield another color. In these devices, it is not possible to use the same binary or ternary combination of elements to provide wavelengths which can be tunable over wide ranges.

Another problem with these well known electroluminescent diodes is that they are generally comprised of ternary compositions that are not easily integrated with other types of semiconductor circuitry, that are usually comprised of silicon or its alloys. This means that the devices are not readily combined with one another on the same wafer and that the processing conditions, such as temperature and deposition techniques, are not always compatible.

In order to provide additional classes of light emitting diodes which have advantages over these known systems, researchers have developed techniques for producing amorphous hydrogenated silicon (a-Si:H) films which will exhibit visible luminescence at room temperature. Thin films of this type are described in the following references: IBM Technical Disclosure Bulletin, Vol. 25, No. 3B, p. 1664, August, 1982, IBM Technical Disclosure Bulletin, Vol. 24, No. 3, p. 1523, August, 1981, D. J. Wolford et al, Physica 117B and 118B, pp. 920–922 (1983), D. J. Wolford et al, Appl. Phys. Lett., Vol. 42, No. 4, p. 369, Feb. 15, 1983.

In order to make suitable a-Si:H films, it is necessary to incorporate large amounts of hydrogen in the films in order to provide defect passivation in the amorphous silicon network. The presence of hydrogen results in a reduction of the density of states in the amorphous silicon energy gap as pointed out by S. C. Gau et al, Appl. Phys. Lett. 39 (5), p. 436, Sep. 1, 1981. Gau et al describes the deposition of device quality a-Si:H films by several techniques including the glow discharge decomposition of silicon bearing gas species ($SiH_4$, $Si_2H_6$, and $SiF_4$). Other techniques for preparing a-Si:H films include sputtering of silicon in a hydrogen atmosphere (W. Paul et al, Solid State Communications, 20, 969 (1976)) and ion beam deposition (F. H. Cocks et al, Appl. Phys. Lett. 36, 909 (1980)).

Amorphous Si:H may also be produced by the pyrolytic decomposition of $SiH_4$. Although this technique is well known, and is generally termed chemical vapor deposition (CVD), little has been published regarding the in-situ preparation of high quality (low spin density, photoconducting, hydrogen passivated) a-SiH films. Even though CVD is an exceptionally clean and well controlled process that is commonly used to prepare high quality polycrystalline and epitaxial silicon thin films, it has been relatively unsuccessful when used to prepare a-Si:H. One of the reasons for this is that high temperatures are required to pyrolyze $SiH_4$. Generally, temperatures in excess of 500° C. are required which cause hydrogen to be evolved from the growing a-Si:H film. In a CVD apparatus, the source gasses and the substrate are generally hot and are at about the same temperature. Thus, the hydrogen required for defect passivation in the amorphous silicon network is evolved from the growing film, which results in an amorphous silicon film displaying a high defect density. The Fermi level is thus pinned near mid-gap, precluding doping, and rendering the material unsuitable for most applications. Consequently, such CVD prepared films must be post-hydrogenated, which reduces the defect density to a level where efficient doping may occur.

One method for enhancing hydrogen incorporation during growth of thin films using CVD is to reduce the CVD operating temperatures. A technique for doing this is to use more easily pyrolyzed silicon sources, such as higher order silanes. Gau et al, referenced above, uses this approach. In Gau et al, a hot wall/hot substrate CVD technique was used in which amorphous silicon:hydrogen films were grown at temperatures as low as 375° C. In their system, argon was used as a carrier gas and the films were doped in-situ by incorporating appropriate amounts of $PH_3$ or $B_2H_6$ in order to dope the films either n-or-p type, respectively.

In the technique of Gau et al, high temperature in-situ doping is used, but it is not possible to incorporate sufficient amounts of hydrogen in order to obtain optical bandgaps inthe visible range, i.e., between 1.6 and 2.6 eV. Such a bandgap is required to have visible light emission at room temperatures, but it cannot be achieved with the technique of Gau et al (for example, see FIG. 2 therein).

Another approach to providing a-Si:H films having a sufficient amount of hydrogen is a plasma discharge method. In this method, infrared photo and electroluminescence has been demonstrated with emission in the range 0.9–1.4 eV. These measurements have been made at liquid nitrogen temperatures, as can be seen by reference to J. I. Pankove et al, Appl. Phys. Lett., 29, 620 (November 1976) and R. A. Street, Advances in Physics, 30, 593 (1981). As a consequence of a high density of non-radiative recombination centers in plasma-prepared films, a small activation energy for thermal quenching of luminescence processes, and the low energies at which the luminescence occurs, the development of electroluminescent devices operating in the visible spectrum at room temperature was not feasible using plasma techniques.

Films of a-Si:H prepared by CVD are generally characterized by extreme insulating properties, having resistivities greater than $10^{11}$ $\Omega$-cm. This requires that they be doped in order to be useful in device structures such as p-n junction devices, p-i-n structures, and Schottky barrier devices. While this can be done in-situ at high temperatures, the resulting films do not exhibit visible electroluminescence.

On the other hand, doping of amorphous materials at low temperatures has been unsuccessful in the past because of the high defect densities that would result. If the defect density of a material is too high, the dopants will not be able to give up their electrons or holes to the conduction or valence bands of the material, and the dopant will be rendered ineffective. In turn, this will yield a material with poor electronic properties.

Consequently, the present invention has as its primary object the development of a process for producing doped a-Si:H films which exhibit visible electroluminescence at room temperatures.

It is another object of the present invention to provide a method for producing electroluminescent devices incorporating at least one layer of doped a-Si:H which can be produced at substrate temperatures less than about 200° C.

It is another object of the present invention to provide a technique for the low temperature preparation of a-Si:H films having sufficient amounts of hydrogen therein to provide a bandgap suitable for producing visible electroluminescence at room temperatures, where the a-Si:H layer can be doped in-situ to a desired conductivity.

It is another object of this invention to provide a low temperature process for producing a-Si:H films which can be doped to any desired conductivity level and type during the low temperature process in which the a-Si:H film is being deposited upon the substrate.

It is another object of the present invention to provide an improved process for producing a-Si:H films, where the films are characterized by high conductivities and electroluminescence in the range 1.6-2.6 eV.

DISCLOSURE OF THE INVENTION

The method of this invention is a low temperature process for producing a-Si:H films which are doped in-situ, i.e., doped while the films are being deposited on a substrate. This method will produce a-Si:H films having a bandgap $E_o$ in the visible range of 1.6-2.6 eV. The amount of hydrogen which can be incorporated in the a-Si:H film is in the range 12 to 50 atomic percent. When these films are incorporated into electroluminescent devices and electrical carriers are passed through the layers, visible light emission will occur at room temperatures.

In this process, homogeneous-CVD is used, as described in the following references: B. A. Scott et al, Appl. Phys. Lett., 39, 73 (1981), B. A. Scott et al, Appl. Phys. Lett., 40, 973 (1982), B. A. Scott et al, J. De Physique, 42, C4-635 (1981), B. A. Meyerson et al, J. of Appl. Phys., 54, No. 3. p. 1461, March, 1983.

In homogeneous CVD, denoted by H-CVD, a hot gas/cold substrate is used. This technique decouples the temperature of the source gas from the substrate, so the substrate can be kept at a much lower temperature. This allows the hydrogen which is incorporated into the growing film from the source gasses to be retained in the growing film, rather than being evolved from it, as is the situation in conventional CVD processes. The source gas is thermally heated to its pyrolyzing temperature and may be pumped to the substrate or carried to the vicinity of the substrate by a carrier, such as argon or nitrogen. The source gas mixtures are typically monosilane ($SiH_4$) or higher order silanes (such as $Si_2H_6$), mixed with dopant sources such as diborane ($B_2H_6$) or phosphine ($PH_3$). H-CVD relies on the gas phase (homogeneous) decomposition of the source molecule, rather than on surface (heterogeneous) decomposition as in standard hot wall/hot substrate CVD techniques. It is this unique combination of H-CVD with substrate temperatures less than about 200° C. and in-situ doping which allows a-Si:H films to be grown which are conducting and which can be used to make electroluminescent devices emitting visible wavelengths at room temperature.

The objects, features, and advantages of the present invention will become apparent from the following more particular description of the preferred embodiments.

BRIEF DESCRIPTION OF THE DRAWING

FIG. 4 also shows photoluminescence energies for films prepared by conventional RF plasma methods.

BEST MODE FOR CARRYING OUT THE INVENTION

H-CVD Process

Homogeneous chemical vapor deposition (H-CVD) is a thermal process which relies upon the gas phase pyrolysis of a source to generate activated species for deposition upon a cooled substrate. For example, the source may be silane ($SiH_4$) containing up to 1.0% diborane ($B_2H_6$) or phosphine ($pH_3$) to provide the dopants in the deposited a-Si:H film. Thus, H-CVD is a hot gas/cold substrate CVD technique which was first used to study the kinetics and mechanism of film growth from $SiH_2$ intermediates generated by the pyrolysis of silane. Reference is made to the above-mentioned publications by B. A. Scott et al for a more detailed analysis of this process.

H-CVD is a method in which a source gas, such as silane, is homogeneously decomposed at a high temperature and low pressure, with a film thus deposited onto a low temperature substrate. This decouples the temperature requirements of the gas phase pyrolysis process from the film growth temperatures in order to prevent the evolution of hydrogen (which is incorporated into the deposited film during growth). In this process, the source gas is drawn through a furnace-heated reactor containing a pedestal on which the substrate is located. The pedestal is cooled, as by nitrogen flow, to maintain its temperature separate and below that of the gasses in the reactor. In the present invention, the metal block substrate holder is maintained at a temperature less than about 200° C. The source gas is heated to its pyrolysis temperature (which depends upon the nature of the source gasses), while the block (substrate) temperature is held below 200° C. An adequate deposition rate is obtained from the homogeneous decomposition reaction by operating just below the gas-phase nucleation threshold.

Figure 1:
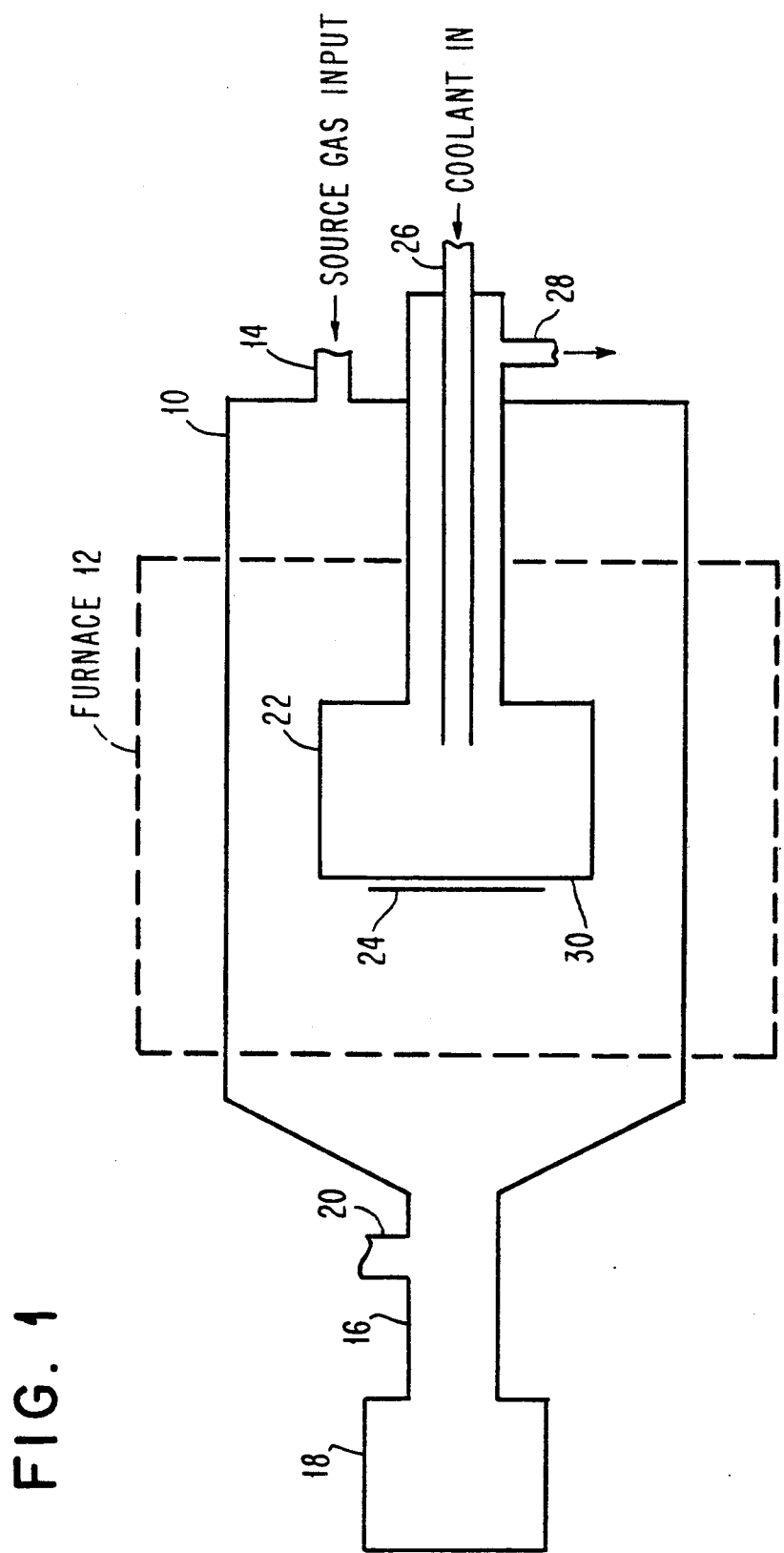
FIG. 1 is a schematic illustration of a suitable apparatus for practicing the present invention, in which H-CVD is used to provide a-Si:H films capable of emitting visible radiation at room temperature.

FIG. 1 shows the deposition apparatus, which is generally a modified low pressure CVD deposition system. It is characterized by a quartz chamber 10 that is surrounded by a furnace 12. Chamber 10 includes an input port 14 for the source gasses and an output port 16 connected to a pump 18 that is used to pump the gasses through chamber 10. A sampling port 20 is provided for attachment to analytical equipment, such as a mass spectrometer (not shown).

A substrate block 22 is provided on which the substrate 24 is located. The substrate block is typically a metal block having tubes therein through which nitrogen can flow for cooling. For example, an input tube 26 is used to admit nitrogen to the block 22, while tube 28 is an exit tube for the nitrogen.

Conventional substrate holders are used to assure good thermal contact between the substrate 24 and the block 22. This is important so that the substrate will be maintained at approximately the temperature of the block and will not increase in temperature above about 200° C. If there is good thermal contact between substrate 24 and block 22, heterogeneous decomposition reactions (as found in conventional CVD) will be quenched, and homogeneous decomposition in accordance with H-CVD will be obtained. This insures that a film can form only by deposition and reaction of intermediates generated in the gas phase. A thermocouple 30 is used to measure the block temperature $T_B(S)$, which is approximately the temperature $T_S$ of the substrate, if there is good thermal contact between the substrate and the block.

In the apparatus of FIG. 1, the substrate 24 is located facing "down stream" of the source gas input 14, but this is not critical. The substrate 24 can be oriented "up stream" in order to have the gas flow directed onto the face of the substrate. Also, many variations of this apparatus can be used in the practice of this method. The important aspect of H-CVD is that the gas temperature and the growth temperature are decoupled from one another so that homogeneous decomposition reactions will take place and will dominate. H-CVD films will dope at least as efficiently as RF plasma prepared a-Si:H films, but will tend to achieve higher conductivities in the limit of heavy doping. This is believed to be due to the fact that H-CVD appears more amenable to high "active" dopant levels than plasma techniques due to the low (approximately 0.1 eV) thermal energy at which H-CVD proceeds, versus approximately 10–100 eV for plasma techniques.

Typical operating conditions include substrate temperatures $T_S$ between about 25° and 200° C., measured at the face of the block 22, a furnace temperature $T_F$ of 700° C. (which is approximately the gas temperature), a pressure P of 1.0 torr., and a source gas flow rate of 22 sccm. The substrate can be any material, including metals (Al, Ta, ...), quartz, and silicon. Growth rates of approximately 30 angstrom/min were achieved, under these conditions.

The present method is directed to the deposition of wide-gap binary amorphous alloys a-Si:$H_x$, where the "mild" thermal process of H-CVD allows the deposition of variable bandgap material exhibiting efficient visible photoluminescence for x greater than 0.3. This emission is attributed to band-to-band processes in the alloy band tails. At room temperature these new materials display emission efficiencies comparable to, or greater than, conventional direct gap light-emitting diode (LED) materials. In contrast, standard RF plasma a-Si:$H_x$ prepared from $SiH_4$ does not exhibit either efficient room temperature, or visible photoluminescence under any deposition conditions.

Electrical Measurements

Electrical measurements on the various samples of a-Si:H films deposited by the method of this invention were carried out using a four electrode coplanar geometry, to determine room temperature conductivity $\sigma_{RT}$, as well as activation energy $E_A$ of conduction. Optical gaps $E_{opt}$ were extracted from plots of $(\alpha E)^{\frac{1}{2}}$ versus E, while compositional information was obtained via infrared IR analysis (hydrogen content), microprobe analysis (phosphorus content), and secondary ion mass spectrotrometry (SIMS) analysis (boron content), and nuclear magnetic resonance (NMR) analysis (hydrogen content).

Optical Measurements

Figure 2:
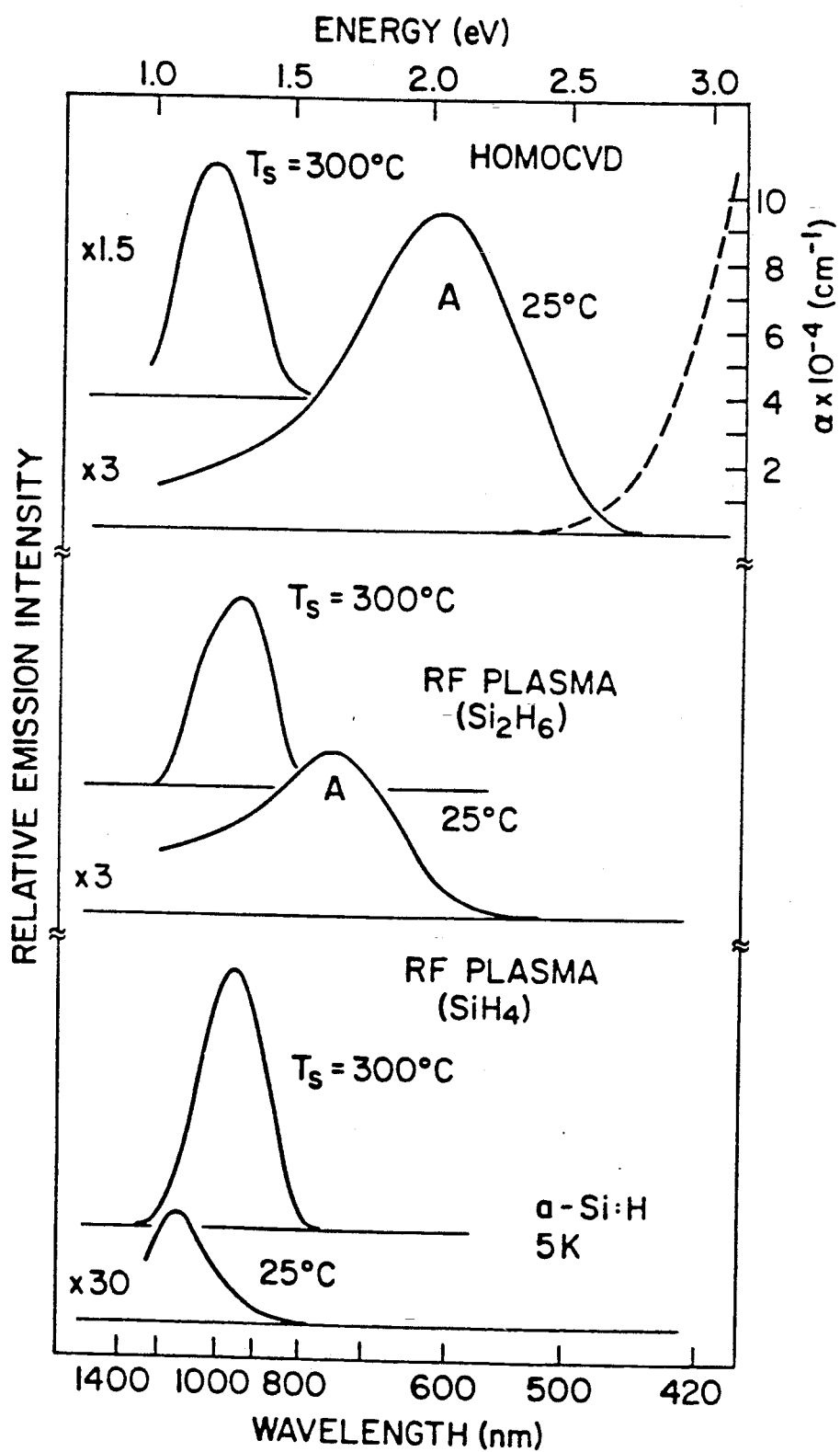
FIG. 2 is a plot of relative emission intensity versus wavelength and energy, for a-Si:H films deposited by homogeneous CVD (H-CVD) and by RF plasma methods.

FIG. 2 is a plot of the relative emission intensity from a-SI:H films grown by different techniques, and compares the 5K photoluminescence of H-CVD films and two varieties of RF plasma-produced films. Each of the films was deposited at the widely differing temperatures of $T_s=300°$ C. and $T_s=25°$ C.

The films of FIG. 2 were 0.8–1.2 micrometers thick, and those produced by H-CVD were grown by thermal decomposition (650° C.) of $SiH_4$. The RF plasma-produced films were prepared from $SiH_4$ and $Si_2H_6$. All of the films were amorphous.

For $T_s=300°$ C., each film shows the 0.28 eV wide transition at 1.3 eV which is characteristic of low defect density a-Si:H. The similarity in photoluminescence shape and intensity, together with the similar spin densities (FIG. 6) indicates that the electronic and structural properties of H-CVD and RF ($Si_2H_6$) plasma prepared films are equivalent to conventional RF ($SiH_4$) plasma prepared films for $T_s$ near 250° C.

Figure 6:
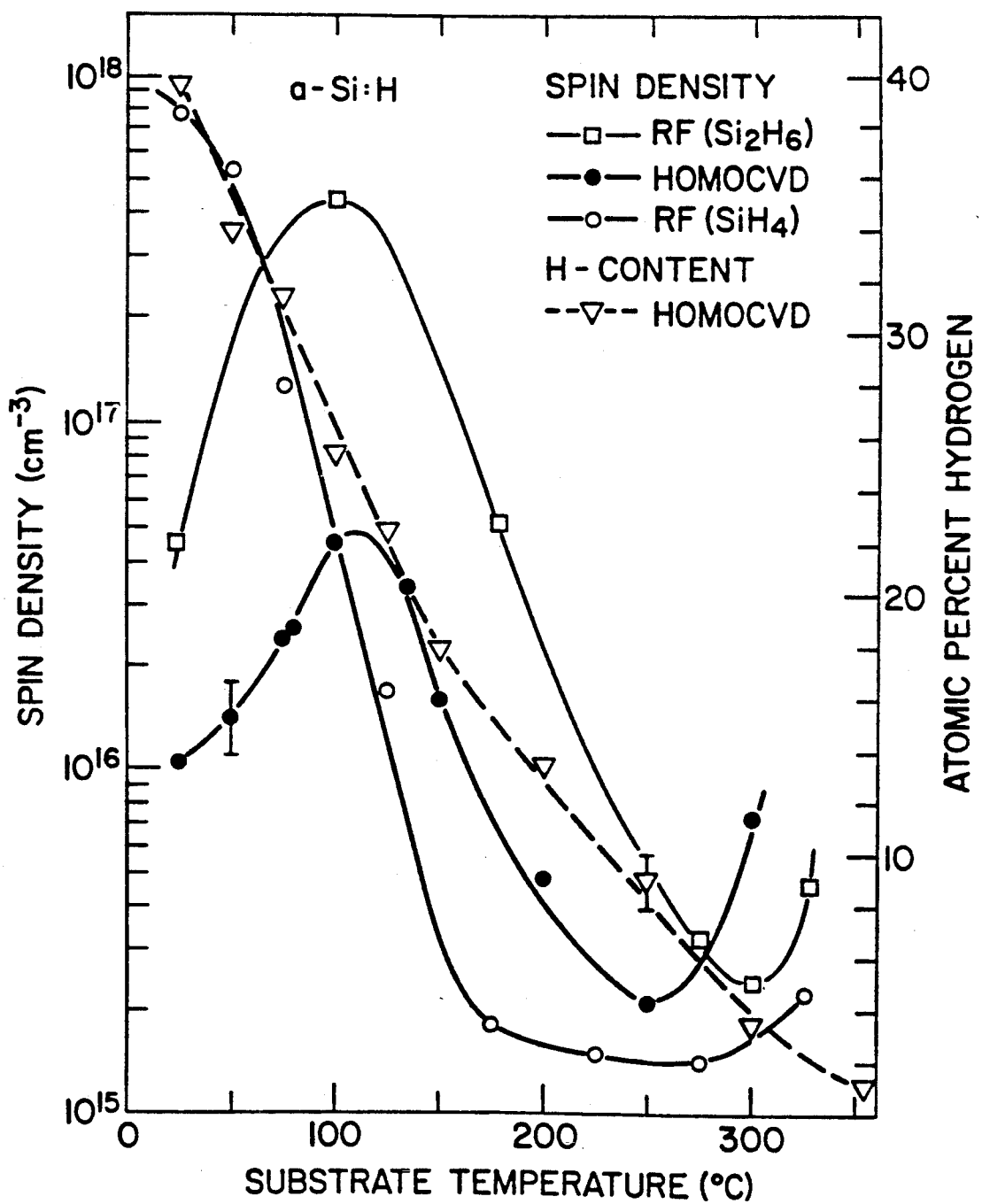
FIG. 6 is a plot of spin density and hydrogen content in a-Si:H films deposited by H-CVD and by RF plasma methods.
Figure 7:
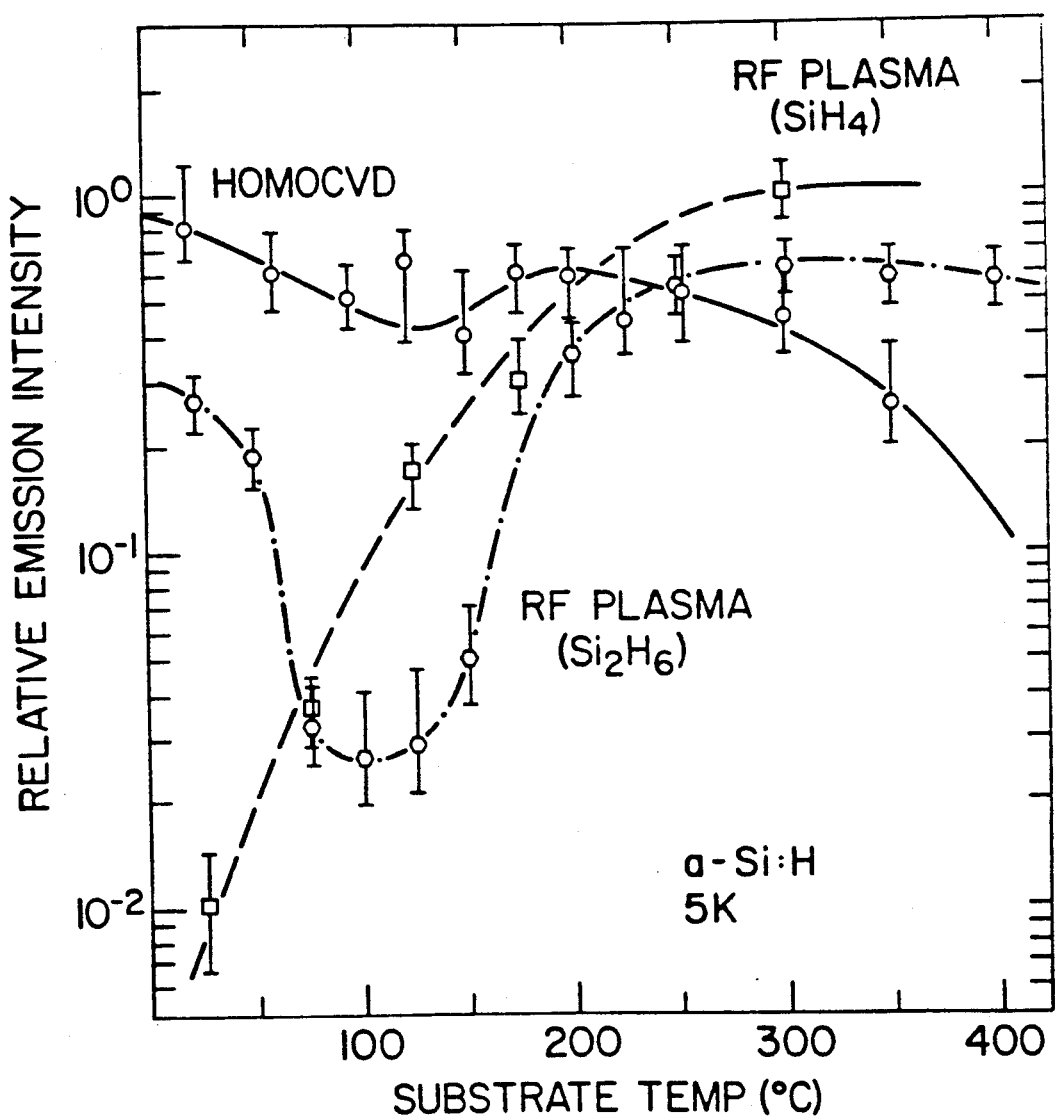
FIG. 7 is a plot of relative emission intensity versus substrate temperature for a-Si:H films deposited by H-CVD and by RF plasma methods.

However, as both FIGS. 1 and 7 illustrate, differences appear as $T_s$ is reduced below about 200° C., becoming most pronounced for room temperature growth. As $T_s$ is lowered, the 1.3 eV photoluminescence of RF ($SiH_4$) films shifts down in energy to near 1.1 eV and rapidly weakens as a consequence of increasing defect density (FIG. 6). In contrast, in H-CVD and RF ($Si_2H_6$) films the 1.3 eV band broadened and new strong emission bands (A) develop toward higher energies with decreasing $T_s$, and a concomitantly increasing optical gap ($E_o$). For the $T_s=25°$ C. extreme, the A band peaks for H-CVD films at an energy 2.054 eV (yellow-orange) with emission tails extending to 2.7 eV, and below 1.0 eV. This represents the largest photoluminescent energies yet reported for a-Si:H. Together, the absorption data of FIG. 2 (dashed line) proves the high energy photoluminescence onset occurs above the $E_o$ gap, in the vicinity of the $E_{04}$ gap, ($\alpha=10^4 cm^{-1}$ 2.65 eV).

Figure 5:
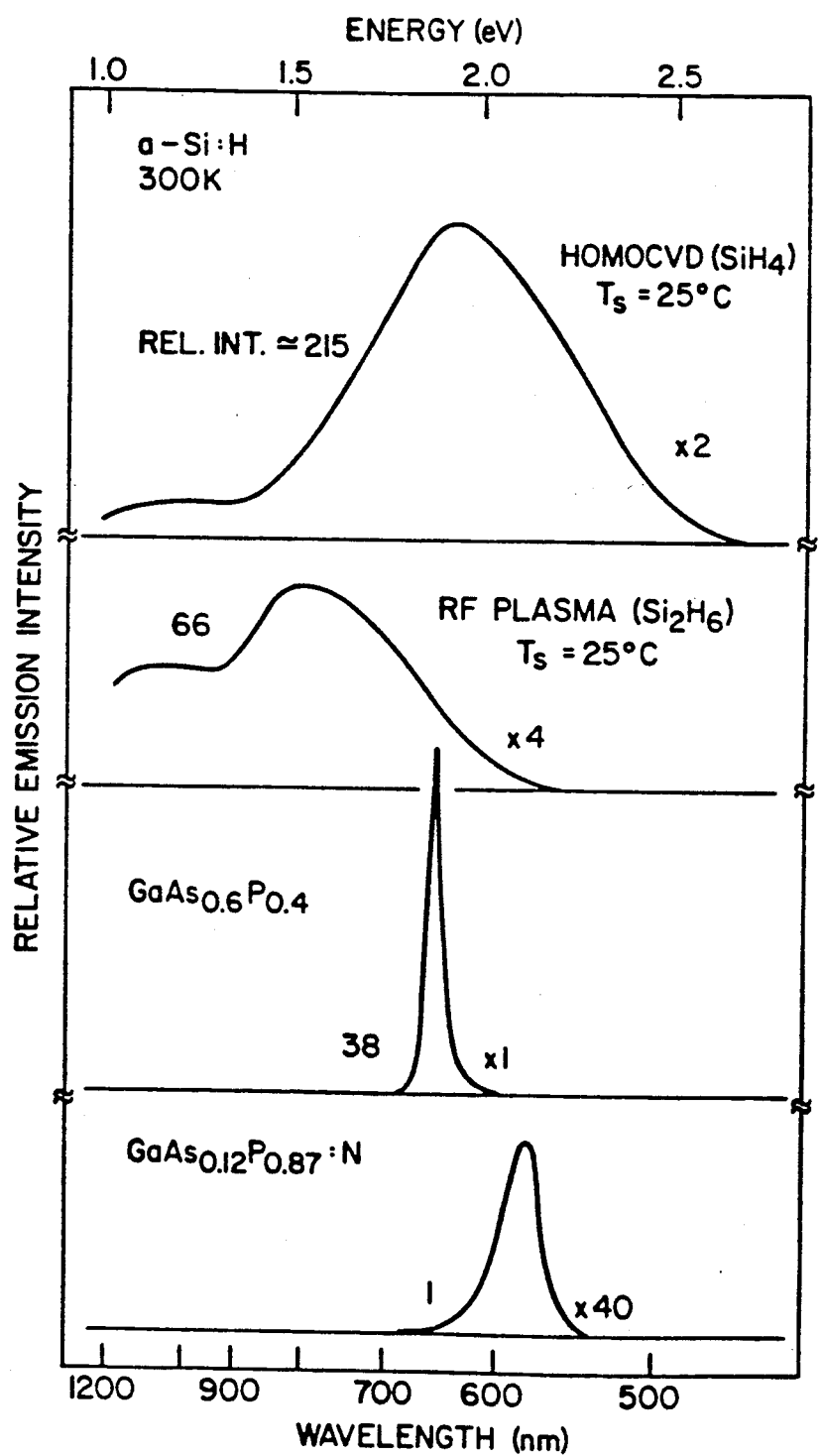
FIG. 5 is a plot of relative emission intensity measured at room temperature from a-Si:H films versus wavelength and energy, indicating the shift in wavelength and relative intensity of the electroluminescence in these films when produced by different techniques, and also in comparison to the emission obtained from the two most common commercial light emitting diode materials of the system $GaAs_{1-x}P_x$.

From FIG. 2, it is apparent that only the low temperature H-CVD films provide efficient room temperature visible luminescence. FIG. 5 shows that result at room temperature.

Figure 3:
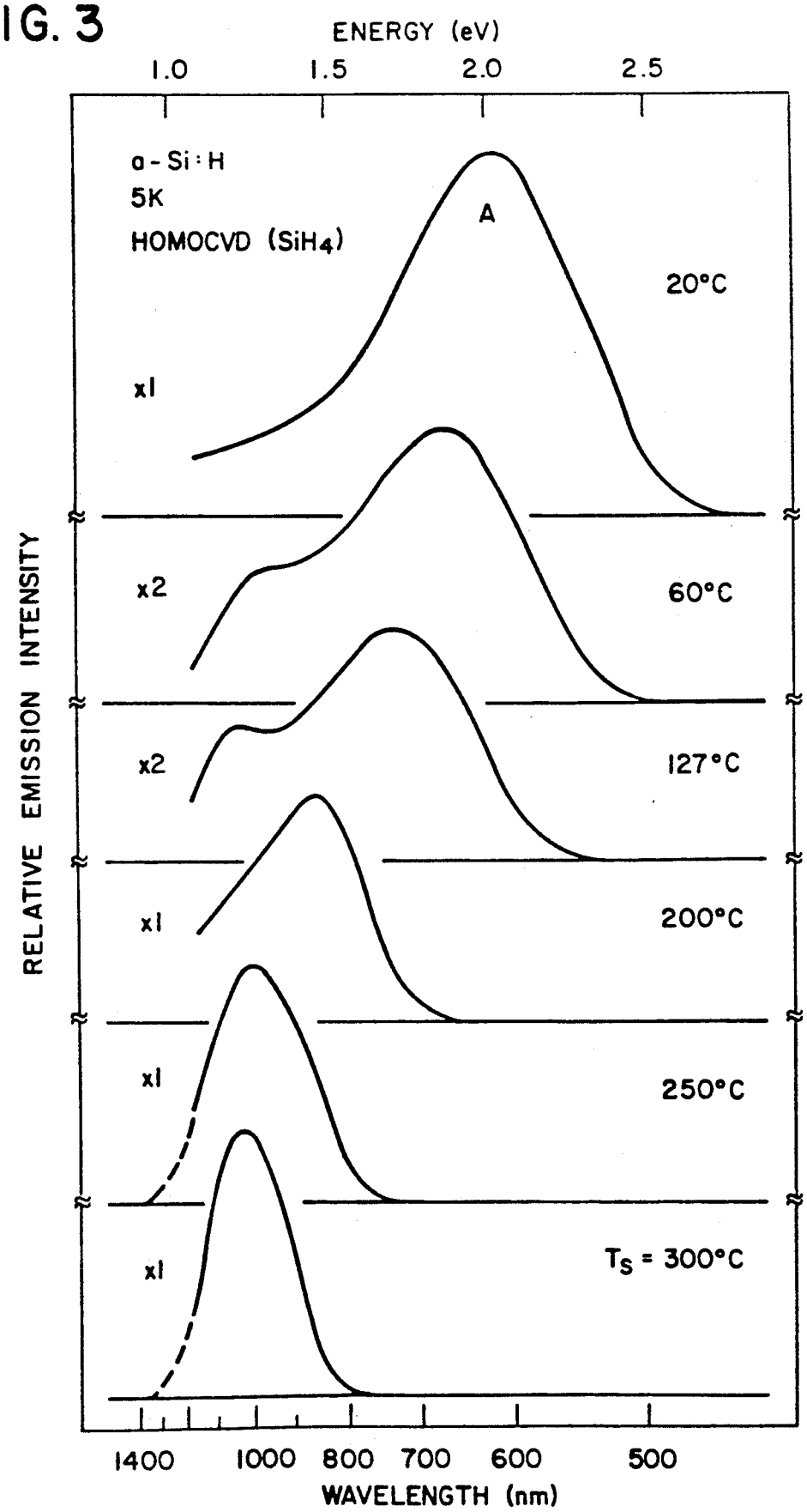
FIG. 3 is a plot of relative emission intensity versus wavelength and energy for electroluminescence from a-Si:H films deposited by H-CVD, for different substrate temperatures.

FIG. 3 is a plot of the relative emission intensity versus wavelength and energy for a-Si:$H_x$ films prepared by H-CVD, using the apparatus of FIG. 1 where the source gas is silane ($SiH_4$). As with the data of FIG. 2, a new strong emission band A develops as the temperature is decreased toward $T_s=20°$ C. Thus, as the growth temperature $T_s$ decreases, visible electroluminescence at room temperature can be achieved in H-CVD deposited thin films of hydrogenated amorphous silicon.

Figure 4:
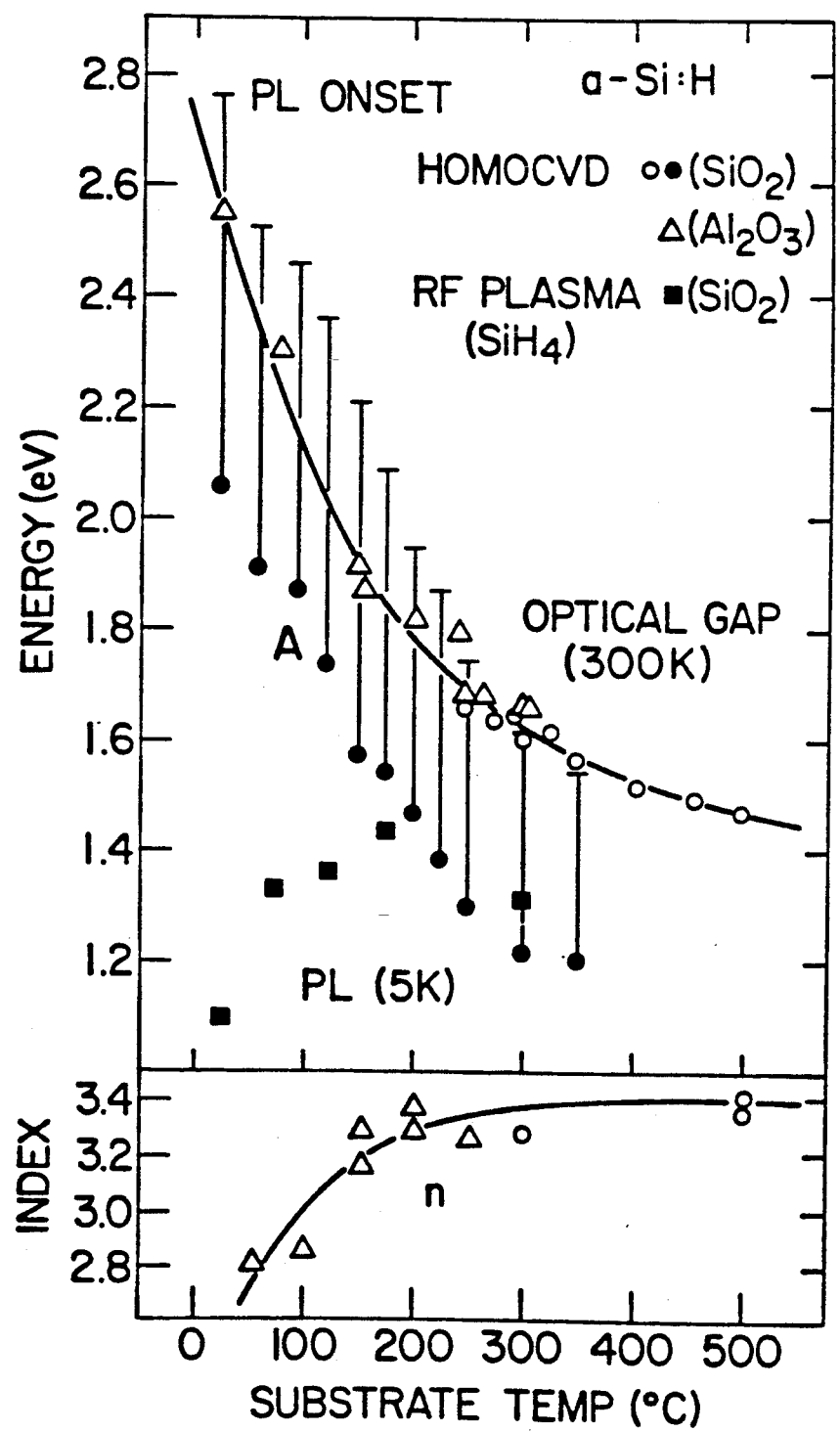
FIG. 4 is a plot of energy gap ($E_o$), peak luminescence energies, and film index versus substrate temperature, for a-Si:H films grown by H-CVD.

FIG. 4 plots energy gaps $E_o$, index n, and 5K photoluminescence peaks versus substrate temperature $T_S$. Luminescence in these films was excited by a $Kr^+$ laser with power densities of approximately 0.2 W/cm². Absorption edges and index data were obtained on H-CVD films from 300K optical transmission. The gaps $E_o$ were defined by the intercept of $(\alpha E)^{\frac{1}{2}}$ plotted against E.

The films measured for FIG. 4 include H-CVD films deposited on $SiO_2$ and $Al_2O_3$, and films deposited by RF plasma of $SiH_4$ on $SiO_2$ substrates. All films were amorphous hydrogenated silicon, as confirmed by Raman scattering and IR absorption measurements.

Compared to conventional a-Si:H, the novel optical results of films produced in accordance with the present invention for decreasing $T_S$ are a consequence of incorporating increasing amounts of H while keeping dangling bond densities low and nearly fixed. The bandgap $E_o$ and the percentage of H in these films increase together monotonically. The increasing gap illustrated in FIG. 3 does not come from progressive removal of gap defect states or disorder, but rather from the increasing influence of Si—H bonding on the a-Si:H band structure. The data suggests that any compositional inhomogeneities extend at most, over a few atomic dimensions.

As $T_S$ is reduced below about 200° C., the infrared (IR) absorption data showed that SiH units are progressively replaced by $SiH_2$ and $(SiH_2)_n$ polysilane chains. These polymers are known to exhibit large bonding-antibonding effective gaps of 4–6.5 eV, depending on chain length. Consequently, one possible view of the wide gap a-Si:$H_x$ films produced by this invention is a low defect density mixture of small gap a-Si:H and increasing amounts of the wide gap short-chain polysilane, so the average gap is increased.

An alternative interpretation comes from considering tight binding descriptions of Si—H bonding. In passivating Si dangling bonds, H forms new bonding states deep within the Si valence bands (with little change in the conduction bands). In doing so, models show that local H density-of-states near the valence band edge erodes, thereby effectively opening the gap. This occurs for SiH units alone. However, if still more H is added, now into $SiH_2$ or short chains, bonding states for these units will also form still deeper in the valence band and further reduce the local valence band energy. If as tight binding suggests, not only SiH, but polysilane units effect the same result of eliminating band edge states (without adding more in the gap as occurs in conventional low $T_S$ a-SI:H preparation), the net result is a smoothly increasing $E_o$ with H content regardless of the types of SiH units formed. This is supported by photoemission results showing a 0.4 eV recession of the valence band edge for low H content and up to 0.8 eV recession in the presence of polysilane.

The new high energy photoluminescence comes from the wide a-Si:$H_x$ gaps. It evolves from the 1.3 eV band and may be traceable to the weak 1.4 eV recombination sometimes seen in a-Si:H. The A band begins above the edge and follows its dependence on $T_s$. It is attributed to recombination of band-tail localized excitons together with possibly strong phonon cooperation to account for the large photoluminescence (PL) width. Resonant excitation experiments support this conclusion. The PL is efficient because of low defect density and persists at room temperature (only in low $T_s$ material) because of increased electron-hole coulomb interaction with decreasing index ($\epsilon/\sim n^2$) in FIG. 4, and possibly from wider band tails. Because $E_o$ has not saturated in FIG. 4, further increases in H incorporation should lead to still larger gaps and higher energy PL.

Because of their somewhat higher defect densities, RF ($Si_2H_6$) films are electronically intermediate between H-CVD films and RF ($SiH_4$) films. This is caused by the diminished (compared with $SiH_4$) but unavoidable scouring reactions inherent in RF plasma.

As is apparent from FIG. 4, only the a-Si:H films produced by H-CVD in accordance with the constraints of the present invention exhibit optical bandgaps between 1.6 and 2.6 eV, i.e., visible radiation.

FIG. 5 plots room temperature photoluminescence of H-CVD films and RF plasma ($Si_2H_6$) prepared films, both of which were deposited at substrate temperatures $T_S = 25°$ C. The photoluminescence of these films is compared to commercially avialable $GaAs_{0.6}P_{0.4}$ and $GaAs_{0.12}P_{0.87}$:N LED materials. As is the situation with the data of FIG. 4, the data of FIG. 5 was obtained by exciting the films with a Kr+ laser having an output at 406.7 nm and a power density of 0.2 W/$cm^2$.

As is apparent from FIG. 5, the H-CVD produced films have a peak luminescence near 2.0 eV, in contrast with the RF plasma produced films which have a peak luminescence near 1.5 eV. This difference is apparent even though both the H-CVD-prepared films and the RF plasma-prepared films were deposited on substrates held at 25° C.

Another interesting aspect of the data leading to FIG. 5 is the fact that luminescent energy from the H-CVD produced films is 215 times more efficient than the luminescence from the $GaAs_{0.12}P_{0.87}$:N film in the bottom curve. Its photoluminescence is also three times as strong as that produced by RF ($Si_2H_6$) plasma-produced films.

FIG. 6 plots the electron spin resonance (ESR) spin densities for H-CVD, RF ($SiH_4$), and RF ($Si_2H_6$) a-Si:H films as a function of substrate temperature. The H content for H-CVD films is also shown as a function of substrate temperature. As the substrate temperature is lowered, the 1.3 eV photoluminescence of RF ($SiH_4$) films shifts down in energy to near 1.1 eV and rapidly weakens as a consequence of increasing defect density. In contrast, for H-CVD and RF ($Si_2H_6$) films, the 1.3 eV band broadens and new strong emission bands develop toward higher energies with decreasing substrate temperature and correspondingly increasing optical gap. For H-CVD films, the optical gap ($E_o$ between about 1.4 and 2.6 eV) and the weak "S-shaped" spin density dependence on the substrate temperature are uncorrelated, whereas $E_o$ and the percentage of hydrogen increased together monotonically. Therefore, the increasing optical gap and photoluminescence energy of the H-CVD produced films comes not from progressive removal of gap defect states, but from the increasing influence of Si—H bonding on a-Si:H band structure.

The different dependencies of dangling bond concentrations on substrate temperature for the various film types in FIG. 6 are connected to processes which eliminate hydrogen from the growing films. However, for H-CVD produced films, the relevant surface reactions, although complex, are not influenced by energetic atoms, radicals, and ions which are present in both RF ($SiH_4$) and RF ($Si_2H_6$) deposition. From FIG. 6, it is clear that for all film types—H-CVD and RF plasma produced films—photoluminescent intensity anticorrelates with spin density. This is illustrated in the RF ($Si_2H_6$) plasma results, where for samples prepared between room temperature and 200° C., the photoluminescence intensity first plunges and then recovers in a 1:1 relationship with the spin density states $N_S$. This trend continues for temperatures above 200° C. On the other hand, for RF ($SiH_4$) films, the photoluminescence changes monotonically with $N_S$ in the same regime, while H-CVD films exhibit only weak variations. These data prove that the Si dangling bond acts as the primary "killer center" for band edge processes in not only RF ($SiH_4$) a-Si:H films, but in all forms of this material.

FIG. 7 plots the relative integrated photoluminescence intensities, obtained at 5K, for H-CVD, and RF plasma-produced films of a-$SiH_x$ as a function of substrate temperature. From these data, it is apparent that the H-CVD produced films produce strong photoluminescence at substrate temperatures below 200° C., in contrast with that produced from RF plasma deposited films. While the photluminescence from the RF ($SiH_4$) films decreases as substrate temperature is reduced, the photoluminescence from RF ($Si_2H_6$) films first decreases and then increases as the substrate temperature is lowered. In contrast, the photoluminescence from the H-CVD produced films dips only slightly and stays at a high level.

Figure 8:
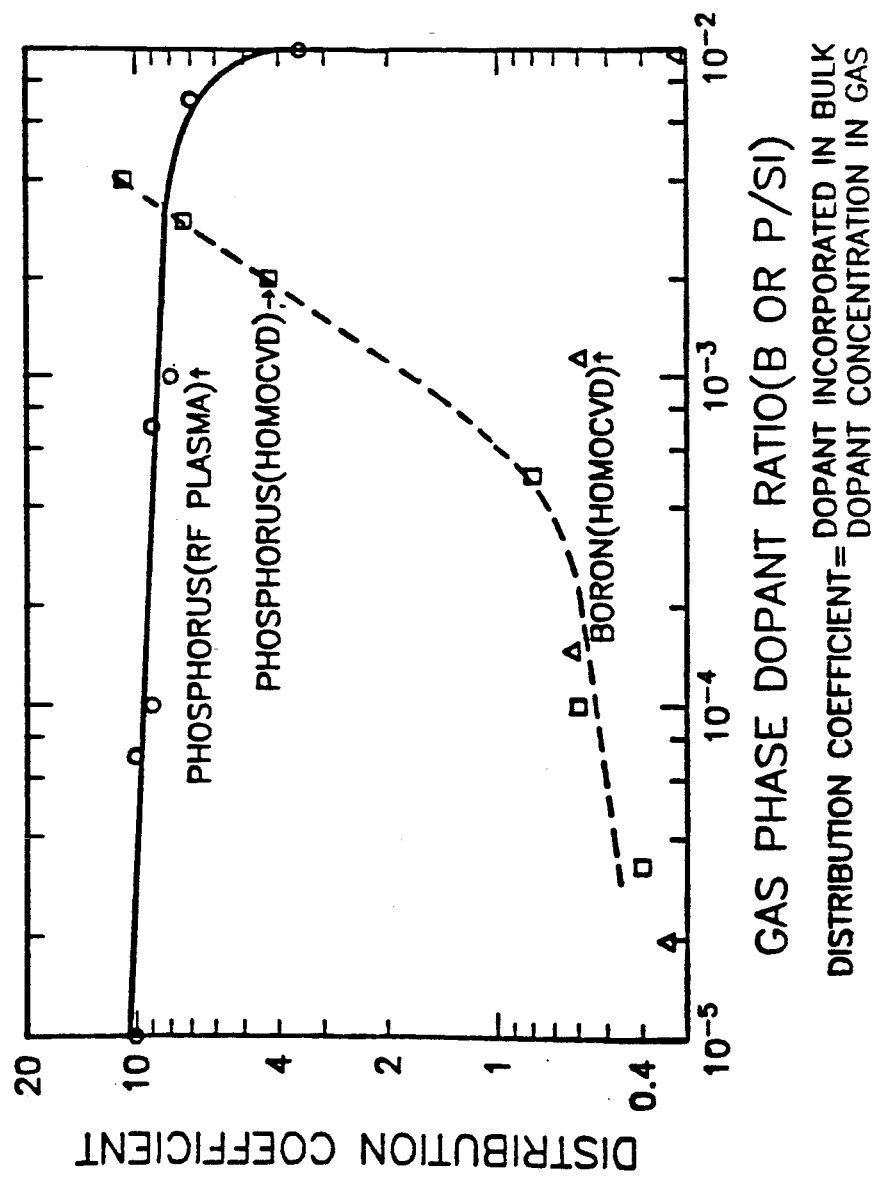
FIG. 8 is a plot used to illustrate doping of a-Si:H films deposited by H-CVD, and more particularly is a plot of the distribution coefficient of the dopant versus the dopant concentration in the film (indicated by the gas phase dopant ratio B/Si or P/Si).

FIG. 8 plots dopant content data of a-Si:H films prepared by RF plasma deposition and by H-CVD. The distribution coefficient $C_D$ is defined as the ratio of bulk dopant content to gas phase dopant concentration (atomic basis). For phosphorus, $C_D$ is between 0.4 and 10.75, and increases monotonically with the gas phase ratio $PH_3/SiH_4$ between $3.3 \times 10^{-5}$ and 0.007. For boron doped samples, $C_D$ is between 0.33 and 0.63, decreasing in both the high and low limit of source gas dopant content.

The high conductivity obtained in a-Si:H films produced by H-CVD allows the fabrication of electroluminescent devices. This high conductivity is due to doping effects rather than morphological effects such as those due to the presence of microcrystalline domains within the domains of the amorphous network. A calculation of the expected dependence of $C_D$ upon the phosphine/silane ratio, assuming independent decomposition pathways for each gas, would be expected to demonstrate that $C_D$ was independent of phosphine partial pressure. However, this is inconsistent with the data that was obtained, and the interpretation is that the data indicates that the presence of a phosphorus/silicon gas phase chemistry, yielding the observed enhancements in $C_D$. This interpretatation is supported by several observations, including the fact that the interaction must proceed in the gas phase because the substrate temperature (below 200° C.) is well below that required to dissociate either source gas in a heterogeneous (surface) process. Also, phosphorus incorporation over the range of substrate temperatures investigated was found to be temperature independent, which would make heterogeneous chemistry unlikely. Also, homogeneous nucleation of particles downstream of the reactor could be induced upon the introduction of small concentrations of phosphine into otherwise stable hot (700° C.) silane gas within the reactor, which is indicative of a homogeneous process.

To account for the enhancement observed in $C_D$, the presence of a silicon/phosphorus intermediate was postulated in the gas phase. The presence of monosilylphosphine ($SiPH_5$) has been verified by mass spectrometry. $SiH_2$ has been established as the primary precursor of films grown by H-CVD, and it is reasonable to expect that silylene insertions into phosphine molecules occur in the $SiH_4/PH_3$ gas mixtures. The considerable enhancement of bulk phosphorus content with increasing gas phase $PH_3$ concentration would therefore result from the presence of $SiPH_5$ (or other unstable Si-P compounds) so generated, as by their generation they deplete silylene radicals otherwise available for film formation, inducing a second order effect.

The great contrast in the behavior of $C_D$ between H-CVD and plasma techniques, which is a consequence of this gas phase chemistry, results in order of magnitude corrections to the doping curves (FIGS. 9 and 10) for solid versus gas phase dopant content, and emphasizes the need to use solid phase dopant levels in presenting the data for doping efficiencies when comparing thermal and plasma preparation methods. This is another example of the uniqueness of H-CVD produced films at low substrate temperatures, in contrast with plasma produced films at the same substrate temperatures.

Figure 9:
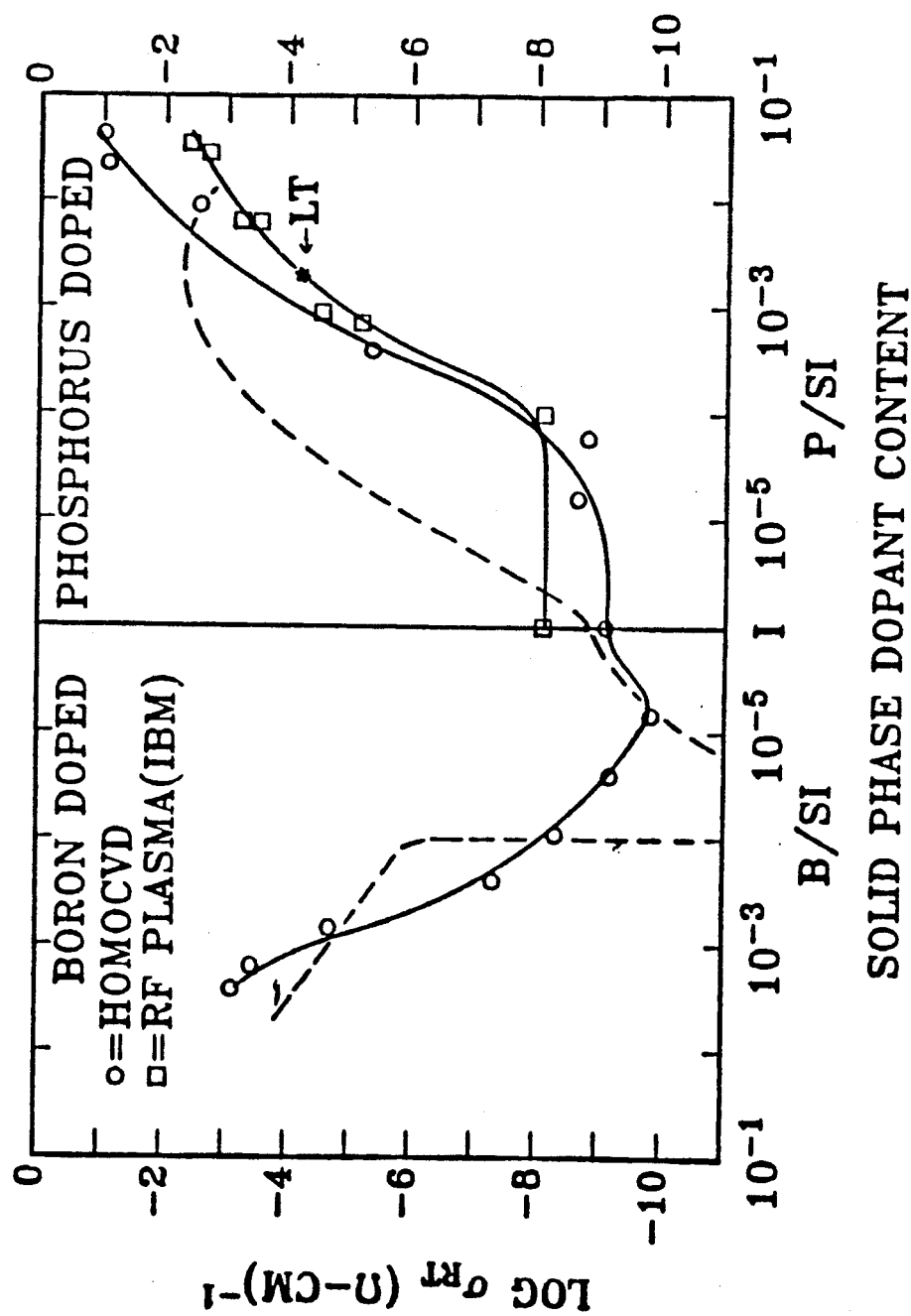
FIG. 9 is a plot of room temperature conductivity $\sigma_{RT}$ versus solid phase dopant levels for H-CVD deposited a-Si:H films and for phosphorus doped films deposited by RF plasma. The dashed line represents data from a published paper where room temperature conductivity is plotted as a function of gas phase dopant concentration.

FIG. 9 plots the log of the room temperature conductivity $\sigma_{RT}$ versus the solid phase dopant content for H-CVD deposited films and for phosphorus doped plasma prepared a-Si:H films. The dashed line represents data from W. E. Spear et al, Phil. Mag. 33, 935 (1976), plotted as a function of gas phase dopant concentration.

Figure 10:
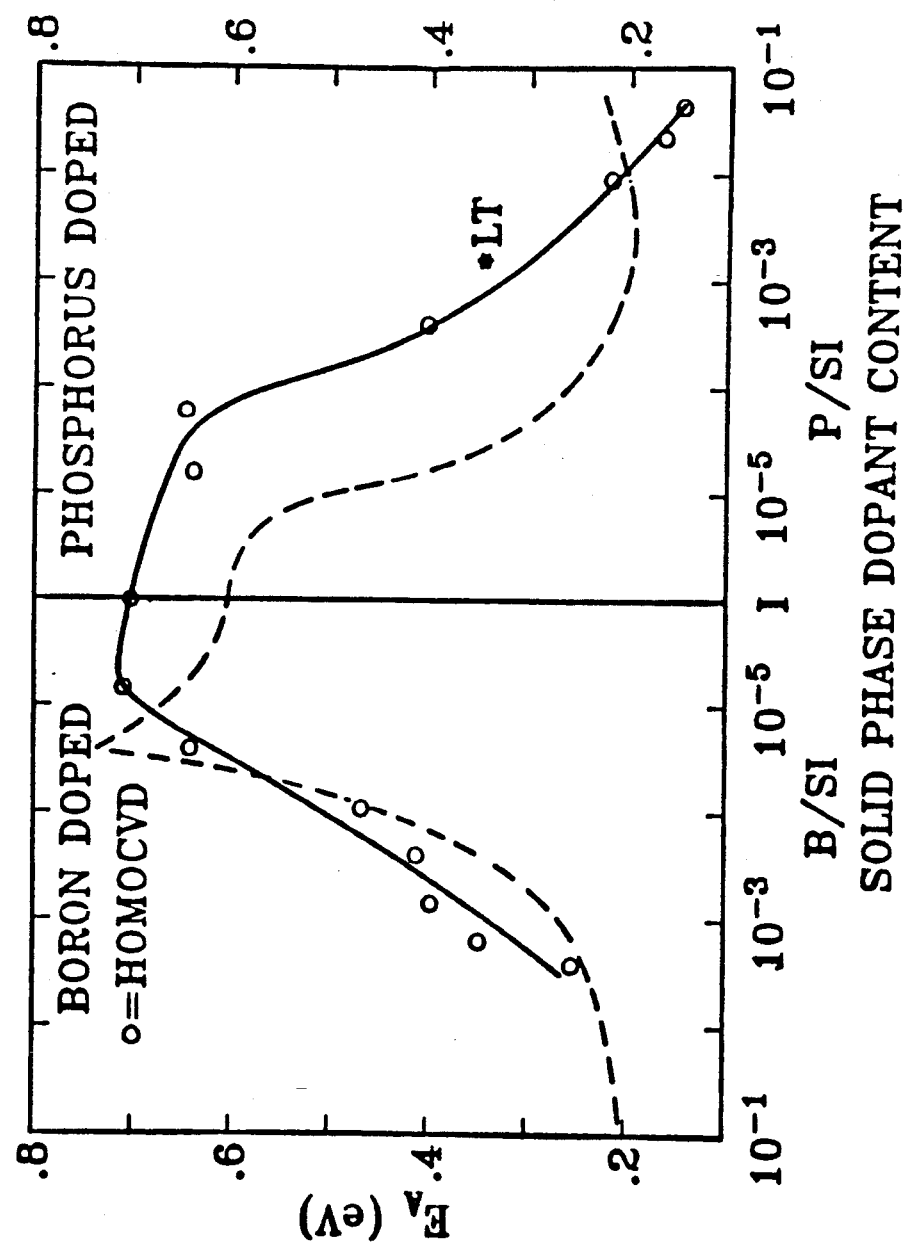
FIG. 10 is a plot of activation energy $E_a$ of conduction versus solid phase dopant levels for a-Si:H films grown by H-CVD. The dashed curve is plotted from data taken from a previously published journal, which plotted activation energy $E_A$ as a function of gas phase (not solid phase) dopant concentration.

FIG. 10 plots activation energy $E_A$ of conduction versus solid phase dopant levels for H-CVD films, also plotted with data from Spear et al, ibid, as a function of gas phase dopant concentration. FIGS. 9 and 10 will be discussed together.

Electrical measurement data leading to FIGS. 9 and 10, against the corrected bulk dopant content, reveal a trend in which H-CVD films achieve both higher conductivities as well as lower activation energies in the doping limits investigated in this data. Saturation of either $\sigma_{RT}$ or $E_A$ has not yet occurred for H-CVD material, which suggests that higher values of $\sigma_{RT}$ and $E_A$ may be obtainable in more heavily doped films. The finding that H-CVD films may be doped more heavily than plasma prepared a-Si:H can be ascribed to either an intrinsically lower defect density in the films, and/or a greater proportion of "active" dopant centers relative to similarly doped plasma films.

Electron spin resonance has shown spin densities of $10^{15}$ cm$^{-3}$ in undoped H-CVD films prepared at 275° C., a concentration comparable through not superior to that found in plasma prepared a-Si:H. However, electron spin resonance cannot detect spinless defects such as gap states induced by the presence of weak or strained bonds, and thus is not an absolute indicator of the equivalence of defect densities in these two materials. The more likely explanation of these results appears to be the more efficient incorporation of "active" dopant centers in the H-CVD films. This interpretation is consistent with the finding that electrical properties are not yet saturated at relatively high doping levels.

It appears that the low energy thermal regime in which H-CVD operates could be a reason for the efficient "active" dopant incorporation in these films. For H-CVD, the gas molecules strike the substrate at energies of 0.1 eV. This is in contrast with plasma methods where ionic species occur that impinge the substrate at energies of 10–100 eV. The greatly reduced energy available at the surface during H-CVD could result in the reduced surface mobility of adsorbed dopant atoms, which slows their migration to potentially inactive sites at defects or at dopant clusters. Clustering of dopant atoms effectively limits the "solubility" of dopants in the a-Si:H network, and the onset of clustering is the point at which additional dopant incorporation ceases to significantly alter electrical properties. Thus, the reduced dopant surface mobility expected during H-CVD should make possible the achievement of greater concentrations of "active" dopant centers than does plasma preparation techniques. Dopant atoms may also be rendered inert by coordination with one or more hydrogen atoms in the a-Si:H network. This effect would be more likely to occur during a plasma process where there are greater concentrations of free H available to bind to the dopant atoms.

The behavior of H-CVD a-Si:H films departs radically from that of plasma prepared material for films deposited at substrate temperatures lower than about 100° C.

Efficient doping of glow discharge a-Si:H prepared films below 100° C. is not feasible, which is a consequence of a rapidly rising defect density (with decreasing substrate temperature), as more hydrogen (as SiH$_x$ units with $x=2$ or greater) is incorporated in the film. In contrast, low temperature prepared H-CVD a:Si:H is readily doped, with results for such a sample displayed as point LT in FIGS. 9 and 10. Prepared at a substrate temperature of 75° C., sample LT displayed an optical bandgap of 2.0 eV, and room temperature conductivity of $8\times10^{-5}/(\Omega\text{-cm})$, with $E_A$ of 30.34 eV for 0.2 at. percent incorporated phosphorus. This is a seven order of magnitude rise in room temperature conductivity, and a 0.4 eV shift of the Fermi level relative to the undoped material also prepared at a substrate temperature of 75° C. Electron spin resonance has verified that there exists a low density of defects (dangling bonds) in low temperature a-Si:H films prepared by H-CVD, of the order of $10^{16}$ cm$^{-3}$ in the substrate temperature range between 25 and 100° C. In this same temperature range, plasma a-Si:H films display $10^{18}$–$10^{19}$ defect centers/cm$^2$ associated with dangling bonds. This contrast is again due to the fundamental differences between plasma and H-CVD energetics. In a plasma process, in order to maintain surface passivation, higher ($T_S=100°$ C. and greater) deposition temperatures are required for hydrogen surface and bulk migration to sites previously stripped of a passivating species of either ion or neutral bombardments. This "scouring" (e.g., by atomic hydrogen or other ionic species) process will not occur during H-CVD because these species are not generated. The major hydrogen removal reactions in H-CVD occur during film crosslinking, which is a potentially defect-free process. On the other hand, at low substrate temperatures, a site stripped of hydrogen by ions or radicals in the plasma process becomes frozen in the bulk, leading to the observed defect densities. Consequently, low temperature H-CVD a-Si:H films may be readily doped.

Electroluminescent Devices

Figure 11:
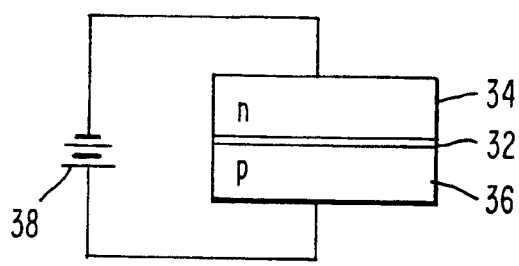
Figure 12:
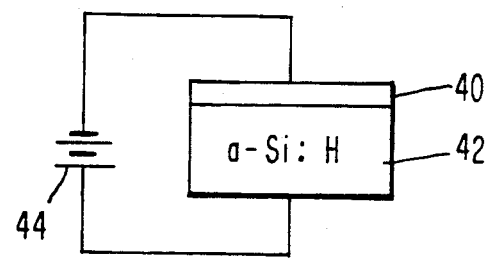
Figure 13:
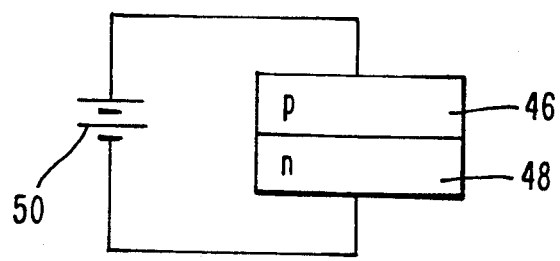

Representative electroluminescent devices that can be prepared in the practice of the present invention are shown in FIGS. 11, 12, and 13. All of these devices use at least one layer of a-Si:H which has been doped in-situ during H-CVD. All films are grown at a substrate temperature less than about 200° C. In these figures, only the electrically active layers are shown. As will be appreciated by those of skill in the art, such as silicon, quartz, etc. Thus, the structures of FIGS. 11–13 are schematic illustrations of electroluminescent devices.

FIG. 11 shows a p-i-n structure in which an intrinsic layer 32 of a-Si:H is located between a n-doped layer 34 of a-Si:H and a p-doped layer 36 of a-Si:H. An electrical source 38 is connected across the structure in the manner shown. Representative doping levels for layers 34 and 36 are $10^{16}$–$10^{19}$ carriers/cm$^3$. In operation, the application of a voltage across the structure of FIG. 11 causes electroluminescence from intrinsic layer 32. If layers 34 and 36 are sufficiently thin, the visible light emitted from layer 32 will pass through these layers. The device of FIG. 11 will emit visible luminescence at room temperatures.

FIG. 12 illustrates a representative structure for a Schottky barrier device. The device is comprised of a metal layer 40, typically Mo, W, etc., in contact with a doped layer of a-Si:H. The conductivity type of the doped layer 42 is not critical, and its doping level is generally $10^{15}$–$10^{16}$ carriers/cm$^3$. A voltage source 44 is connected to the structure of FIG. 12. This structure is also capable of visible electroluminescence at room temperature.

FIG. 13 shows a representative p-n junction structure in which a-Si:H layers 46 and 48 are in contact, forming a p-n junction therebetween. A voltage or current source 50 is connected to the device. A representative doping level for these layers is a level in excess of about $10^{16}$ carriers/cm$^3$.

While three types of structures suitable for providing electroluminescence are shown in FIGS. 11–13, it will be understood by those of skill in the art that other structures can also be used. In the fabrication of these structures, at least one layer of a-Si:H$_x$ is present where this layer has been prepared by H-CVD with substrate temperatures less than about 200° C., and doped in-situ. The a-Si:H layer is capable of emitting visible radiation at room temperatures. In particular, radiation of energies 2.0–2.6 eV can be emitted at room temperature from these devices.

Although the invention has been illustrated by particular embodiments thereof, it will be apparent to those of skill in the art that variations can be made without departing from the spirit and scope of the present invention. For example, the amount of hydrogen in the a-Si:H film can be varied, as by adjusting the substrate temperature during growth, and is typically in the range 12–50 atomic percent. The doping levels can also be changed to suit the particular use and structure of the electroluminescent device, which must be capable of emitting visible electroluminescence at room temperature from the a-Si:H layer.

In the practice of this invention, a method is described for the preparation of a-Si:H films exhibiting novel optical properties. These films exhibit room temperature electroluminescence in the visible range, and efficient doping is provided in-situ without the need for post-hydrogenation techniques. Doping is accomplished efficiently, but saturation of electrical properties at high doping levels was not reached. This invention represents the first time that doped a-Si:H films having large optical gaps ($E_o$ at least as great as 2.0 eV) has been accomplished. The efficient visible electroluminescence obtained in these films of a-Si:H$_x$ alloys occurs not only at cryogenic temperatures, but also at room temperatures. The key to these results is the growth of this material with low spin density over a wide H content range, which can be achieved only by the relatively mild H-CVD technique. If the films are grown at substrate temperatures less than 200° C., the films can be doped to high levels in order to make the electroluminescent devices of the present invention.

While the invention has been illustrated by particular embodiments thereof, it will be understood by those of skill in the art that variations can be made thereto, without departing from the spirit and scope of the present invention.

What is claimed is:

1. A method for preparing a device emitting visible electroluminescence at room temperature when said device is electrically contacted and carriers are injected therein, said device being comprised of at least one layer of doped amorphous hydrogenated silicon (a-Si:H) on a substrate, and wherein said method includes the steps of:
    depositing a layer of a-Si:H by thermally induced homogeneous CVD onto a substrate held at a temperature not exceeding about 200° C., said a-Si:H having a bandgap $E_o$, where $E_o$ is between 1.6 and 2.6 eV, the amount of hydrogen in said a-Si:H layer being in the range 12–50 atomic percent,
    doping said a-Si:H layer in-situ while it is being deposited onto said substrate to a doping level at least about $10^{16}$ carriers/cm$^3$, and
    electrically contacting said device.

2. The method of claim 1, where said a-Si:H layer is doped to have n-type conductivity.

3. The method of claim 1, where said a-Si:H layer is doped to have p-type conductivity.

4. The method of claim 1, where source gasses are present in a reactor and are pyrolyzed thermally to cause homogeneous decomposition of said gasses to yield silicon and hydrogen which deposit onto said substrate, said source gasses including a gas providing a dopant for incorporation into the deposited a-Si:H layer.

5. The method of claim 4, where said source gasses providing silicon are selected from the group consisting of monosilane and higher order silanes.

6. The method of claim 5, where said gas providing said dopant is selected from the group consisting of phosphine and diborane.

7. The method of claim 1, where the optical bandgap of said a-Si:H layer is between 2.0 and 2.6 eV.

8. A method for making a device including a layer of amorphous hydrogenated silicon (a-Si:H) on a substrate having an optical bandgap between 1.6 and 2.6 eV and a carrier concentration of at least $10^{16}$ carriers/cm$^3$, comprising the steps of:
    locating a substrate in a reactor including a thermal furnace in which source gasses can be introduced and pyrolyzed by said furnace,
    introducing source gasses containing silicon and hydrogen and a suitable dopant into said reactor and producing a sufficient temperature by said furnace to pyrolyze said gasses to cause homogeneous decomposition of said gasses at a location remote from said substrate,
    passing said decomposed gasses to the vicinity of said substrate which is held at a temperature below 200° C., and condensing silicon, hydrogen, and said dopant onto said substrate to provide an in-situ doped amorphous hydrogenated layer on said substrate, said amorphous layer being comprised of a sufficient amount of hydrogen to have an optical bandgap between 1.6 and 2.6 eV at room temperature, and a sufficient amount of doping to have a doping level at least about $10^{16}$ carriers/cm$^3$ and
    forming an electrical contact to said amorphous hydrogenated layer.

9. The method of claim 8, where said electrical contact forms a Schottky barrier with said amorphous hydrogenated silicon layer.

10. The method of claim 8, where said source gasses including silicon and hydrogen are selected from the group consisting of monosilane and higher order silanes.

11. The method of claim 10, where said dopant source gas includes either phosphorus or boron.

12. The method of claim 10, where the thickness of said amorphous layer is less than one micrometer.

13. The method of claim 8, where said optical bandgap is between 2.0 and 2.6 eV at room temperature.

* * * * *